United States Patent [19]

East et al.

[11] Patent Number: 5,057,588

[45] Date of Patent: Oct. 15, 1991

[54] VINYLIDENE CYANIDE ALTERNATING COPOLYMERS

[75] Inventors: Anthony J. East, Madison; Anthony B. Conciatori, Chatham, both of N.J.

[73] Assignee: Hoechst Celanese Corp., Somerville, N.J.

[21] Appl. No.: 491,138

[22] Filed: Mar. 9, 1990

[51] Int. Cl.$^5$ .............. C08F 22/34; B29C 35/02; B06B 1/02; G11C 13/02

[52] U.S. Cl. .................... 526/300; 264/221; 264/24; 307/400

[58] Field of Search ............ 526/297, 300; 264/22, 264/24; 307/400

[56] References Cited

U.S. PATENT DOCUMENTS

| | | | |
|---|---|---|---|
| 2,615,868 | 10/1952 | Miller | 526/172 |
| 2,716,105 | 8/1955 | Gilbert et al. | 526/297 |
| 2,716,106 | 8/1955 | Gilbert et al. | 526/297 |
| 2,975,158 | 3/1961 | Sayre | 526/297 |
| 4,302,408 | 11/1981 | Ishihara et al. | 264/22 |
| 4,345,359 | 8/1982 | Micheron | 264/22 |
| 4,346,505 | 8/1982 | Lemonon et al. | 264/22 |
| 4,591,465 | 5/1986 | Miyata et al. | 264/24 |
| 4,668,449 | 5/1987 | Soni et al. | 264/22 |
| 4,684,337 | 8/1987 | Bauer | 264/22 |
| 4,767,169 | 8/1988 | Teng et al. | 350/96.14 |
| 4,830,795 | 5/1989 | Scheinbeim et al. | 264/24 |
| 4,863,648 | 9/1989 | Scheinbeim et al. | 264/24 |

FOREIGN PATENT DOCUMENTS

| | | | |
|---|---|---|---|
| 60-94414 | 5/1985 | Japan | 526/297 |
| 0887574 | 12/1981 | U.S.S.R. | 526/297 |

Primary Examiner—Edward J. Smith
Assistant Examiner—N. Sarofin
Attorney, Agent, or Firm—P. S. Kalyanaraman

[57] ABSTRACT

In one embodiment this invention provides vinylidene copolymers with alternating monomeric units as illustrated by the following structure:

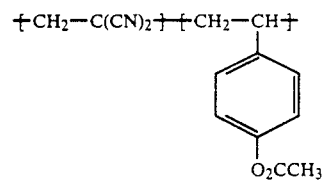

An invention vinylidene copolymer in the form of an electret film exhibits a high level of longitudinal piezoelectric effect, and has excellent processability and thermal stability properties.

8 Claims, No Drawings

VINYLIDENE CYANIDE ALTERNATING COPOLYMERS

This invention was made with Government support under Contract Number F49620-87-C-0109 awarded by the United States Air Force. The Government has certain rights in this invention.

BACKGROUND OF THE INVENTION

Electrets of organic materials are produced by applying a DC voltage to stretched films of polymers such as polyvinyl fluoride, polyvinylidene fluoride, polyvinyl chloride, polyvinylidene fluoride, polyvinyl chloride, polyacrylonitrile, polycarbonate or nylon 11, while maintaining the films at high temperature and then cooling. These films exhibit piezoelectric and pyroelectric properties.

Polymeric electret elements are useful in electroacoustic conversion devices, electro-mechanical conversion devices, pressure-sensitive elements, bimorph elements, microwave-detection devices, image-recording light-sensitive elements, and the like.

Publications of background interest with respect to the present invention include U.S. Pat. Nos. 2,615,868 and 4,591,465, which describe copolymers of vinylidene cyanide.

There is continuing interest in the development of novel polymeric materials which exhibit improved piezoelectric and pyroelectric properties, and superior moldability and thermal stability.

Accordingly, it is an object of this invention to provide novel copolymers which exhibit piezoelectric and pyroelectric properties.

It is a further object of this invention to provide polymeric electret films which exhibit a high longitudinal piezoelectric effect.

Other objects and advantages of the present invention shall become apparent from the accompanying description and examples.

DESCRIPTION OF THE INVENTION

One or more objects of the present invention are accomplished by the provision of a copolymer which is characterized by alternating monomeric units corresponding to the formula:

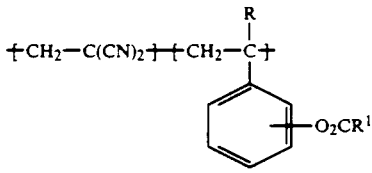

where R is hydrogen, halogen or a $C_1$–$C_4$ alkyl substituent; and $R^1$ is hydrogen or a $C_1$–$C_8$ hydrocarbyl substituent.

Illustrative of R and $R^1$ substituents, respectively, are chloro, bromo, methyl, ethyl, propyl, n-butyl, hexyl, octyl, cyclohexyl, phenyl, and the like.

A present invention vinylidene cyanide copolymer typically has a weight average molecular weight in the range between about 5000–200,000. The copolymers generally are soluble in organic solvents such as dimethylformamide, acetone or butyrolactone, and insoluble in benzene or toluene.

The polymerization can be conducted by dissolving vinylidene cyanide and the styrene monomer (1:1) in an aromatic solvent such as toluene, and heating the reaction mixture at a temperature between about 30°–100° C. for a period of about 0.5–2 hours. The copolymer separates as a white powder during the polymerization reaction. The rate of polymerization can be accelerated by the addition of about 0.01–1% by weight, based on monomer weight, of a catalyst such as a peroxygen compound as exemplified by benzoyl peroxide, cumene hydroperoxide, tertiary-butyl hydroperoxide, and the like.

In another embodiment this invention provides an electret film of a thermoplastic copolymer which is characterized by alternating monomeric units corresponding to the formula:

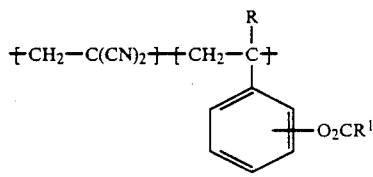

where R is hydrogen, halogen or a $C_1$–$C_4$ alkyl substituent; and $R^1$ is hydrogen or a $C_1$–$C_8$ hydrocarbyl substituent; wherein the film has an external electric field-induced net dipolar orientation of polymer molecules, and the film exhibits piezoelectric properties.

The electret film exhibits an enhanced level of piezoelectric and pyroelectric response if the film copolymeric matrix additionally has a crystallographic molecular orientation in the film plane which has been induced by longitudinal uniaxial mechanical stretching, or by longitudinal and transverse biaxial mechanical stretching, prior to the electric field polarization procedure. Techniques for molecular orientation in polymeric electret films by stretching or by an electric field are described in publications such as U.S. Pat. No. 4,302,408 and U.S. Pat. No. 4,591,465.

A vinylidene cyanide copolymer film of the present invention can be formed by press molding, calender molding or solvent casting. The film can be stretched 2–6 lengths by mechanical monoaxial or biaxial stretching with a calender rolling or stretching apparatus.

Poling of a polymeric electret film can be accomplished by heating the film at a temperature which is lower than the glass transition temperature, applying a DC electric field (100–1500 kv/cm) to the film by electrodes for a period of about 0.1–2 hours, and then cooling the film while maintaining the external field poling bias.

A present invention vinylidene cyanide copolymer has excellent processability and thermal stability properties, and can be formed into an electret film which is amenable to stretching and electric field modes of molecular orientation, and which exhibits a high piezoelectric modulus.

As a further advantage of a present invention vinylidene cyanide copolymer, the acyloxy substituent on the styrene monomeric structure can be modified or replaced with a group which exhibits a desirable property, such as nonlinear optical susceptibility.

The following examples are further illustrative of the present invention. The components and specific ingredients are presented as being typical, and various modifications can be derived in view of the foregoing disclosure within the scope of the invention.

EXAMPLE I

Preparation of an alternating copolymer of vinylidene cyanide and 4-acetoxystyrene in accordance with the present invention.

All glassware was acid-washed, dried and treated with trimethylsilyl chloride in toluene.

Vinylidene cyanide was prepared by the pyrolysis of 1-acetoxy-1,1-dicyanoethane at 650° C. in a vertical quartz tube packed with quartz fragments. The crude pyrolysis product was collected in a cold trap at −60° C., and redistilled under reduced pressure into a receiver containing a trace of methanesulfonic acid to inhibit polymerization.

The vinylidene cyanide content of the pyrolyzate was estimated by allowing a sample to homopolymerize in water, and recovering the polymer. It was determined that a 21 g quantity of pyrolyzate was equivalent to 10 g of pure vinylidene cyanide.

A reaction flask fitted with a stirrer, reflux condenser and pressure-equalizing tap-funnel was heated to 70° C. The reactor was charged with a mixture of 21 g of redistilled pyrolysate (10 g), 10 ml of glacial acetic acid and 1.0 ml of a 4% w/v solution dibenzoyl peroxide catalyst in dry chlorobenzene. 4-Acetoxystyrene (20 g) was added in portions to the reaction flask contents at 70° C. After a polymerization period of about 1.5 hours, vinyl acetate was added to react with any residual vinylidene cyanide.

The excess vinyl acetate was decanted and the resultant white precipitate was recovered and dissolved in acetone. The acetone solution was added to methanol to reprecipitate the polymer (24 g).

The infra-red spectrum showed a weak cyanide band at 22809 cm$^{-1}$, which is characteristic of polymers with a gem-dicyano structure. Nuclear Magnetic Resonance (proton and Carbon-13) indicated that the polymer was a regularly alternating copolymer of vinylidene cyanide and 4-acetoxystyrene. Differential Scanning Colorimetry indicated that the polymer was amorphous, with a strong glass transition temperature inflexion at about 182° C. The inherent viscosity as measured in a 0.5% w/v solution in gamma-butyrolactone was 1.22° at 25° C.

Anal. calc. for alternating copolymer:
C,69.53; H,4.95; N,11.89
Found:
C,70.00; H,5.00; N,11.67.

Following the procedures described above, copolymers of vinylidene cyanide are produced with each of the following comonomers:
alpha-methyl-3-acetoxystyrene;
alpha-chloro-2-propanoyloxystyrene;
4-butanoyloxystyrene; and
4-benzoyloxystyrene.

EXAMPLE II

This Example illustrates the dielectric properties of a vinylidene cyanide/4-acetoxystyrene copolymer in accordance with the present invention.

A butyrolactone solution of a vinylidene cyanide/4-acetoxystyrene copolymer was spin-coated onto conductive indium-tin oxide glass slides, and a gold electrode was vacuum deposited on the surface of each copolymer-coated glass slide.

Each glass slide was heated to 170° C, and poled by applying a gradually increasing DC electric field. The maximum electric-field was equivalent to about 85 volts/micron. Above this voltage level dielectric breakdown occurred.

Each poled film was measured for its pyroelectric coefficient "p", and its linear opto-electronic coefficient "r". The pyroelectric coefficient "p" was measured by a method substantially as described in J. Phys. E., 5, 787 (1972) by Hartley et al; and the opto-electronic coefficient "r" was measured by a laser reflectance technique as described in Proc. S.P.I.E., 1147, 222 (1989) by Haas et al. The measured values were compared with those for a known vinylidene cyanide/vinyl acetate type of copolymer. The comparative data are summarized in Table I.

The relative permittivity and dielectric loss properties of the invention vinylidene cyanide/4-acetoxystyrene copolymer were measured and compared with the vinylidene cyanide/vinyl acetate copolymer. The comparative data are summarized in Tables II-III.

TABLE I

| FILM NUMBER | LOADING LEVEL % | THICKNESS MICRONS | FIELD V/μm | T °C. | "p" | "r" pm/V |
|---|---|---|---|---|---|---|
| Vinylidene cyanide/vinyl acetate copolymer | | | | | | |
| 1. | 8 | 8.5 | 100 | 167 | 5.5 | — |
| 2. | 8 | 8.1 | 100 | 167 | 10.6 | 1.00 |
| 3. | 8 | 8.3 | 100 | 167 | 9.2 | 0.97 |
| Vinylidene cyanide/4-acetoxystyrene copolymer | | | | | | |
| 4. | 10 | 4.26 | 80 | 170 | 3.5 | — |
| 5. | 10 | 6.03 | 65 | 170 | 4.4 | 0.47 |
| 6. | 14 | 5.7 | 85 | 163 | 3.5 | — |
| 7. | 14 | 3.75 | 80 | 167 | 3.6 | — |

TABLE II

| | Relative Permittivity (epsilon) | |
|---|---|---|
| FREQUENCY kH$_2$ | COPOLYMER$^{(1)}$ | COPOLYMER$^{(2)}$ |
| 0.1 | 4.34 | 4.86 |
| 1.0 | 4.15 | 4.76 |
| 10.0 | 3.97 | 4.68 |
| 100.0 | 3.80 | 4.58 |

$^{(1)}$Vinylidene cyanide/vinyl acetate
$^{(2)}$Vinylidene cyanide/4-acetoxystyrene

TABLE III

| | Dielectric Loss (tan delta) | |
|---|---|---|
| FREQUENCY kH$_3$ | COPOLYMER$^{(1)}$ | COPOLYMER$^{(2)}$ |
| 0.1 | 4.10 | 1.30 |
| 1.0 | 3.05 | 1.27 |
| 10.0 | 3.17 | 1.66 |
| 40.0 | 3.37 | 3.40 |
| 100.0 | 4.90 | 5.80 |

$^{(1)}$Vinylidene cyanide/vinyl acetate
$^{(2)}$Vinylidene cyanide/4-acetoxystyrene

What is claimed is:

1. A copolymer which is characterized by alternating monomeric units corresponding to the formula:

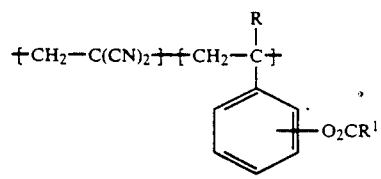

where R is hydrogen, halogen or a $C_1$–$C_4$ alkyl substituent; and $R^1$ is hydrogen or a $C_1$–$C_8$ hydrocarbyl substituent.

2. A copolymer in accordance with claim 1 wherein R is hydrogen or methyl.

3. A copolymer in accordance with claim 1 wherein $R^1$ is methyl or phenyl.

4. A copolymer in accordance with claim 1 wherein the copolymer has a weight average molecular weight in the range between about 5000–200,000.

5. An electret film of a thermoplastic copolymer which is characterized by alternating monomeric units corresponding to the formula:

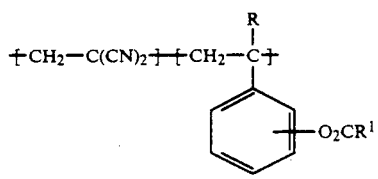

where R is hydrogen, halogen or a $C_1$–$C_4$ alkyl substituent; and $R^1$ is hydrogen or a $C_1$–$C_8$ hydrocarbyl substituent; wherein the film has an external electric field-induced net dipolar orientation of polymer molecules, and the film exhibits piezoelectric properties.

6. An electret film in accordance with claim 5 wherein R in the copolymer formula is hydrogen or methyl, and $R^1$ is methyl.

7. An electret film in accordance with claim 5 wherein the film is characterized additionally by a crystallographic orientation of copolymer molecules in the film plane which has been induced by mechanical stretching.

8. An electro-acoustic conversion or electro-mechanic conversion or pressure-sensitive device having an electret film component of a copolymer which is characterized by alternating monomeric units corresponding to the formula:

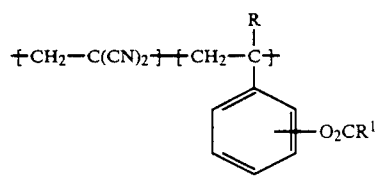

where R is hydrogen, halogen or a $C_1$–$C_4$ alkyl substituent; and $R^1$ is hydrogen or a $C_1$–$C_8$ hydrocarbyl substituent; wherein the film has an external electric field-induced net dipolar orientation of polymer molecules, and the film exhibits piezoelectric properties.

* * * * *